United States Patent
Vijaykumar et al.

(10) Patent No.: US 11,855,451 B2
(45) Date of Patent: Dec. 26, 2023

(54) BOOTSTRAPPED LINE-PROTECTOR CMOS SWITCH

(71) Applicant: Analog Devices International Unlimited Company, Limerick (IE)

(72) Inventors: Sharad Vijaykumar, Bangalore (IN); Patrick C. Kirby, Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 166 days.

(21) Appl. No.: 17/482,917

(22) Filed: Sep. 23, 2021

(65) Prior Publication Data

US 2022/0102971 A1 Mar. 31, 2022

Related U.S. Application Data

(60) Provisional application No. 63/083,339, filed on Sep. 25, 2020.

(51) Int. Cl.
*H02H 9/04* (2006.01)
*H03K 17/687* (2006.01)

(52) U.S. Cl.
CPC ......... *H02H 9/046* (2013.01); *H03K 17/6872* (2013.01)

(58) Field of Classification Search
CPC ............... H02H 9/046; H03K 17/6872; H03K 2217/0063; H03K 2217/0081; H03K 17/0822; H01L 27/0266
USPC ....................................................... 361/91.1
See application file for complete search history.

(56) References Cited

U.S. PATENT DOCUMENTS

| | | | |
|---|---|---|---|
| 5,446,303 A | 8/1995 | Quill et al. | |
| 5,689,395 A * | 11/1997 | Duffy | H02H 3/025 361/93.6 |
| 5,726,505 A * | 3/1998 | Yamada | H02J 7/0031 361/84 |
| 5,864,458 A * | 1/1999 | Duffy | H02H 3/025 361/10 |
| 7,864,497 B2 * | 1/2011 | Quardt | H02S 50/00 136/244 |
| 7,952,419 B1 * | 5/2011 | Birk | H03K 17/063 327/434 |
| 8,710,541 B2 | 4/2014 | Aherne et al. | |
| 11,557,981 B2 * | 1/2023 | Heath | H02M 7/217 |
| 2005/0180068 A1 * | 8/2005 | Lopata | G06F 1/28 361/18 |
| 2009/0154045 A1 * | 6/2009 | Bleus | H02H 3/025 361/93.9 |
| 2010/0284116 A1 * | 11/2010 | Yoshizawa | H02H 9/001 361/91.3 |

(Continued)

*Primary Examiner* — Dharti H Patel
(74) *Attorney, Agent, or Firm* — Schwegman Lundberg & Woessner, P.A.

(57) ABSTRACT

A line protector circuit comprises an external side switch circuit coupled to an external circuit node of the line protector circuit, an internal side switch circuit coupled in series to the external side switch circuit and an internal circuit node of the line protector circuit, a high supply circuit node and a low supply circuit node, and switch control circuitry configured to deactivate the internal side switch circuit and divert a bias current from the external side switch to the low supply circuit node when the external voltage exceeds a high supply voltage of the high supply circuit node.

18 Claims, 8 Drawing Sheets

(56) References Cited

U.S. PATENT DOCUMENTS

| | | | |
|---|---|---|---|
| 2011/0032652 A1* | 2/2011 | Shimada | H02M 5/293 361/91.2 |
| 2011/0115544 A1* | 5/2011 | Birk | H03K 17/063 327/427 |
| 2014/0293666 A1* | 10/2014 | Merz | H02M 1/32 361/13 |
| 2015/0333500 A1* | 11/2015 | Boe | H02H 3/20 361/91.1 |
| 2016/0072322 A1* | 3/2016 | Yoshimatsu | H02J 7/007182 361/86 |
| 2016/0254660 A1* | 9/2016 | Dawley | H02H 1/0007 361/86 |
| 2021/0234362 A1* | 7/2021 | Bouche | H02H 3/021 |
| 2022/0337233 A1* | 10/2022 | Kaymaksut | H03K 17/693 |
| 2023/0098647 A1* | 3/2023 | Bouche | H02H 3/021 361/91.1 |

* cited by examiner

BOOTSTRAPPED LINE-PROTECTOR CMOS SWITCH

CLAIM OF PRIORITY

This application claims the benefit of priority to U.S. Provisional Application Ser. No. 63/083,339, filed Sep. 25, 2020, which is hereby incorporated by reference herein in its entirety.

BACKGROUND

An integrated circuit (IC) can receive electrical signals from off chip electronics. Protection from excessive voltage is a concern for ICs. For example, excessive voltage can occur due to electrostatic discharge (ESD) or even miswiring. High voltages from static or transient voltage events such as an ESI event or miswiring can damage internal circuits of an IC. The present inventors have recognized a need for improved protection of integrated circuits from static and transient events.

SUMMARY OF THE DISCLOSURE

This document relates generally to line protector switches and methods of their operation. In an aspect, a line protector circuit includes an external side switch circuit coupled to an external circuit node of the line protector circuit, an internal side switch circuit coupled in series to the external side switch circuit and an internal circuit node of the line protector circuit, a high supply circuit node, a low supply circuit node, and switch control circuitry configured to deactivate the internal side switch circuit and by diverting a small bias current from the external side switch to the low supply circuit node when the external voltage exceeds a high supply voltage of the high supply circuit node.

In another aspect, a method of operating a line protector circuit includes monitoring an external voltage connected to an external side switch circuit of the line protector circuit. The line protector circuit includes the external switch circuit connected in series with an internal side switch circuit and the internal side switch circuit is connected to internal circuitry. The method further includes deactivating the internal side switch circuit and diverting a small bias current from the external side switch to a low supply circuit node when an external voltage exceeds a high supply voltage of the line protector circuit.

In another aspect, an electronic system includes a line protector circuit including: an analog switch circuit coupled to an external circuit node of the line protector circuit and an internal circuit node of the line protector circuit, a high supply circuit node, a low supply circuit node, switch control circuitry configured to deactivate the internal circuit node connection of the analog switch and diverting a small bias current from the external circuit node to the low supply circuit node when the external voltage exceeds a high supply voltage of the high supply circuit node, a bypass switch circuit connected to the internal circuit node, and bypass switch logic circuitry configured to maintain a connection to the internal circuit node when the external voltage exceeds the high supply voltage.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Integrated circuits can be inadvertently exposed to excessive voltages. A line protector switch circuit can protect an integrated circuit (IC) when the voltage of an external connection to the IC, such as an input/output (I/O) pad for example, is outside the limits of the supply voltages of the IC.

Figure 1:
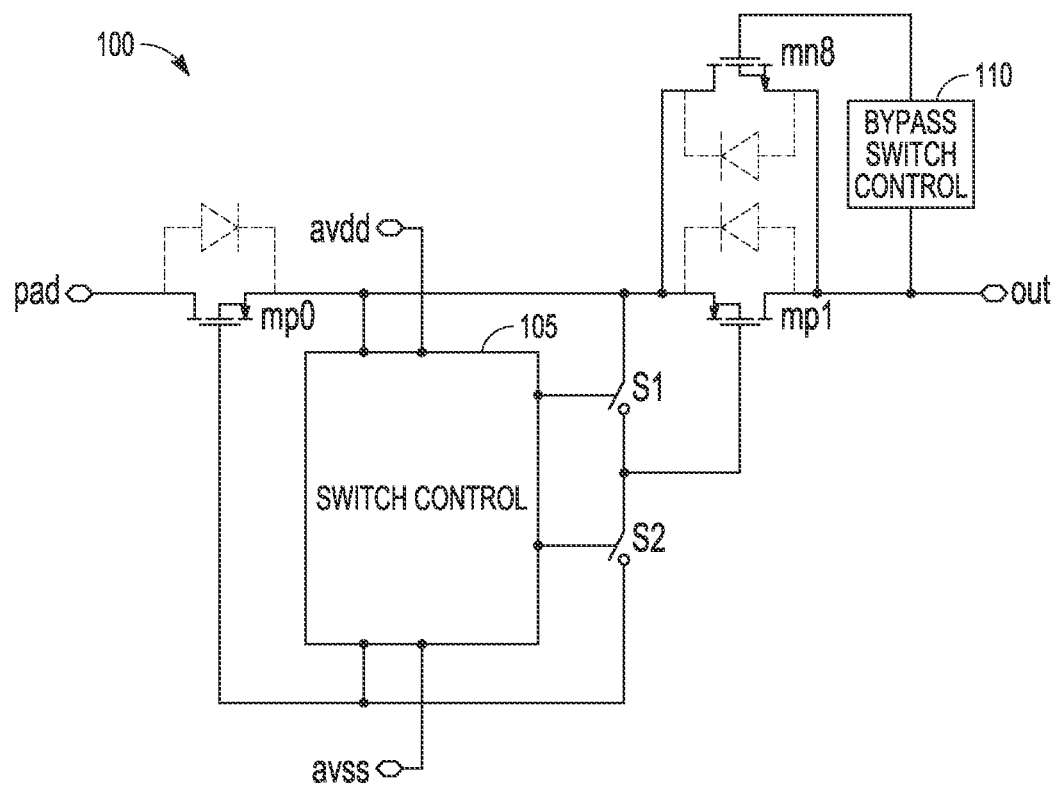
FIG. 1 is a block diagram of an example of a bootstrap line protector switch circuit.

FIG. 1 is a block diagram of an example of a bootstrap line protector switch circuit 100. The bootstrapped line protector switch works like an analog switch when the external input is within the supply voltage range of the switch. The analog switch turns off when the external input voltage at 'pad' exceeds the supplies. The main switch devices are transistors 'mp0' and 'mp1' The transistors are p-type metal oxide semiconductor (PMOS) transistors. Transistor 'mp0' is an external side switch connected to the external connection 'pad,' and transistor 'mp1' is an internal side switch connected to an internal connection 'out' of the IC. For example, connection 'out' may be an internal circuit node connected to internal circuitry of the IC that is to be protected by the line protector switch circuit 100.

Transistors 'mp0' and 'mp1' have the bulk region of the transistors connected to the source region of the transistors. The diodes resulting from this connection are shown in dotted lines in FIG. 1. Transistors 'mp0' and 'mp1' are connected in such a way that these diodes are never forward biased at the same time. In a wafer fabricated with a p-type substrate, a PMOS device is preferred as 'mp0.' Transistor 'mp1' can be either a PMOS device or an NMOS device, although a PMOS device is preferred for 'mp1' because a PMOS device will remain conductive even when a voltage at the input is dose to the high supply voltage (avdd).

In the example of FIG. 1, the line protector switch circuit includes PMOS devices 'mp0,' 'mp1,' and n-type MOS (NMOS) device 'mn8' which provide a conductive path between terminals 'pad' and 'out.' A switch control circuitry 105 monitors the voltage at the source terminal of 'mp0' and generates a voltage at the gate terminal of 'mp0.' The switch control circuitry 105 further controls two switches S1 and S2. Depending on the state of S1 and S2, transistor 'mp1' is turned on or off. Transistor 'mn8' is a bypass switch device connected in parallel to "mp1." The gate voltage of 'mn8' is generated by bypass switch control circuitry 110.

Figure 2:
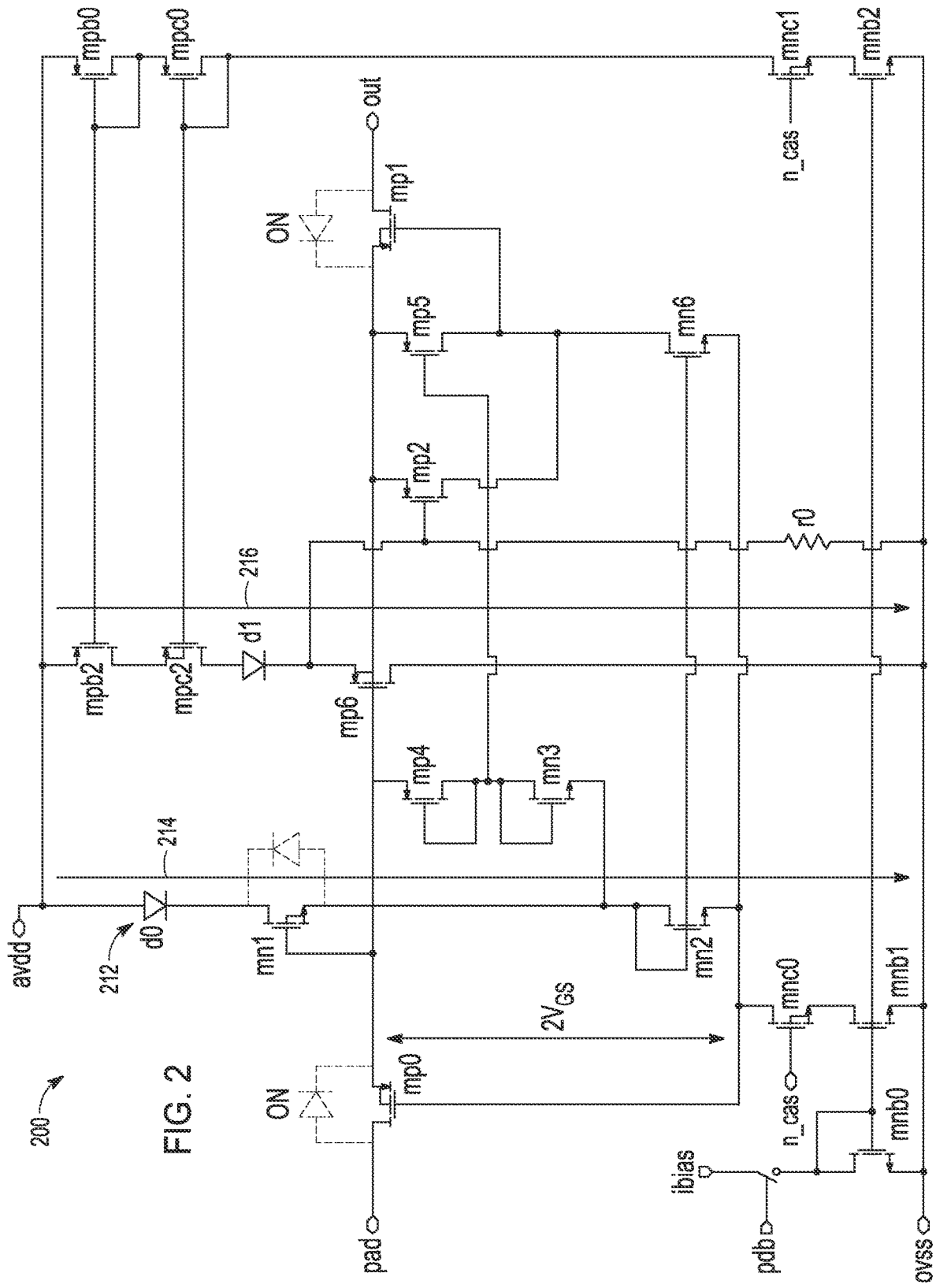
FIG. 2 is a circuit schematic of another example of a bootstrap line protector switch circuit.

FIG. 2 is a circuit schematic of another example of a bootstrap line protector switch circuit 200. The example of FIG. 2 omits the bypass switch device 'mn8' and the bypass switch control circuitry 110 of FIG. 1 to simplify the example. As in the example of FIG. 1, the circuit node labeled 'pad' is connected to an external pin or pad, and the circuit node labeled 'out' is the node to which the internal circuits that need to be protected are connected. When the voltage at the terminal 'pad' is within the high and low supply rails of the switch (shown as avdd and ayss, respectively), current flows through the circuit path containing zener diode 212 as shown by line 214. A voltage of two gate-source voltages or 2Vgs (due to vgs,mn1+vgs,mn2) is developed across transistor 'mp0' turning it on. There is no current flowing through devices 'mp4' and 'mp5' as there is not enough gate-source voltage to turn them on. The device 'mp5' is off and 'mn6' is on as they have the same gate-source connection as 'mp4' and 'mn2' respectively. There is another circuit path in which current flows shown by line 216. This circuit path ensures that device 'mp2' is off as its gate is pulled high by the source terminal of 'mp6.' The circuit node labeled 'mp1_g' connected to the gate of transistor 'mp1' is pulled low to the voltage at circuit node 'mp0_g' (connected to the gate of transistor 'mp0') also turning 'mp1' on. Thus, both transistors 'mp0' and 'mp1' are on.

Figure 3:
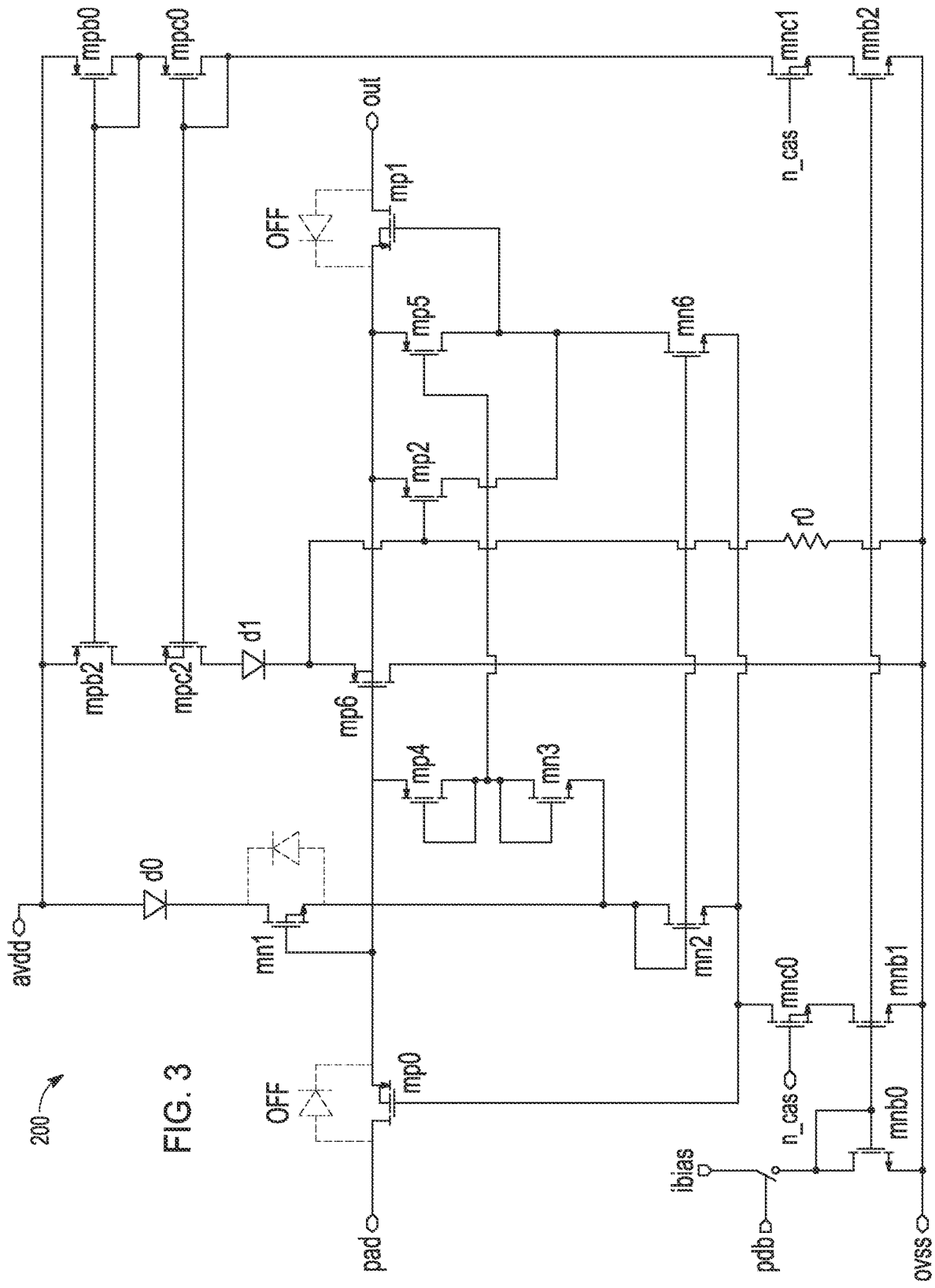
FIGS. 3 and 4 are circuit schematics of the example bootstrap line protector switch circuit of FIG. 2 in different operating conditions.

FIG. 3 is a circuit schematic of the example bootstrap line protector switch circuit 200 of FIG. 2 in a different operating condition. In this operating condition, the voltage at 'pad' is lower than the low supply voltage of low supply circuit node 'ayss.' Because transistor 'mp0' is a PMOS device, 'mp0' cannot conduct voltages less than 'ayss.' The internal bulk-source diode of mp0 is also reverse biased ensuring that there is no conductive path from 'pad' to 'out'. Transistors 'mp0' and 'mp1' are both off.

Figure 4:
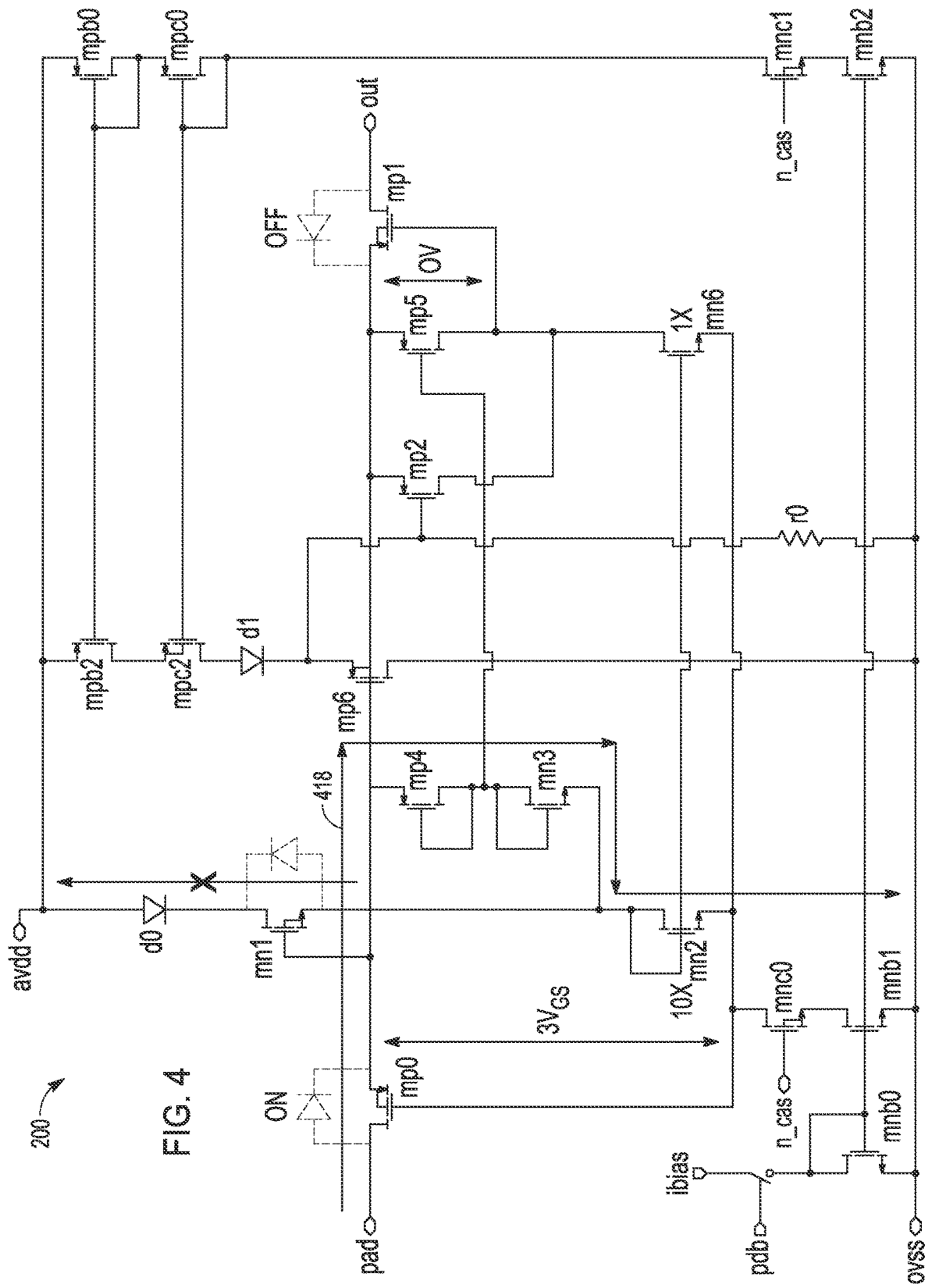

FIG. 4 is a circuit schematic of the example bootstrap line protector switch circuit 200 of FIG. 2 in a different operating condition. In this operating condition, the voltage at 'pad' is greater than the high supply voltage of high supply circuit node 'avdd.' When the voltage at the external terminal 'pad' exceeds the high supply voltage, the current flow through transistor 'mn1' is cut-off, because its drain terminal voltage becomes lower than its source terminal voltage. An alternate current path from the circuit path 212 in FIG. 2 turns on. This is shown in FIG. 4 as path 418. A small bias current is diverted from the external side switch to the low supply circuit node. The diode 'd0' is reverse biased and prevents any current from flowing from 'pad' to 'avdd' through the bulk-drain diodes of transistors 'mn2' and 'mn1.' The width-to-length ratio (W/L) of transistor 'mn6' is smaller compared to the W/L of transistor 'mn2.' In this implementation, a ratio of 10:1 between devices 'mn2' and 'mn6' is used. The current path 418 shows there is current flowing through device 'mp4.' The device 'mp5' is sized such that it is turned on stronger compared to device 'mn6.' Devices 'mp4' and 'mp5' can have same W/L for simplicity. This ensures that circuit node 'mp1_g' is pulled up and turns transistor 'mp1' off. There is no conductive path from 'pad' to 'out' and the circuits connected to terminal 'out' are protected from the external voltage at 'pad.'

Figure 5:
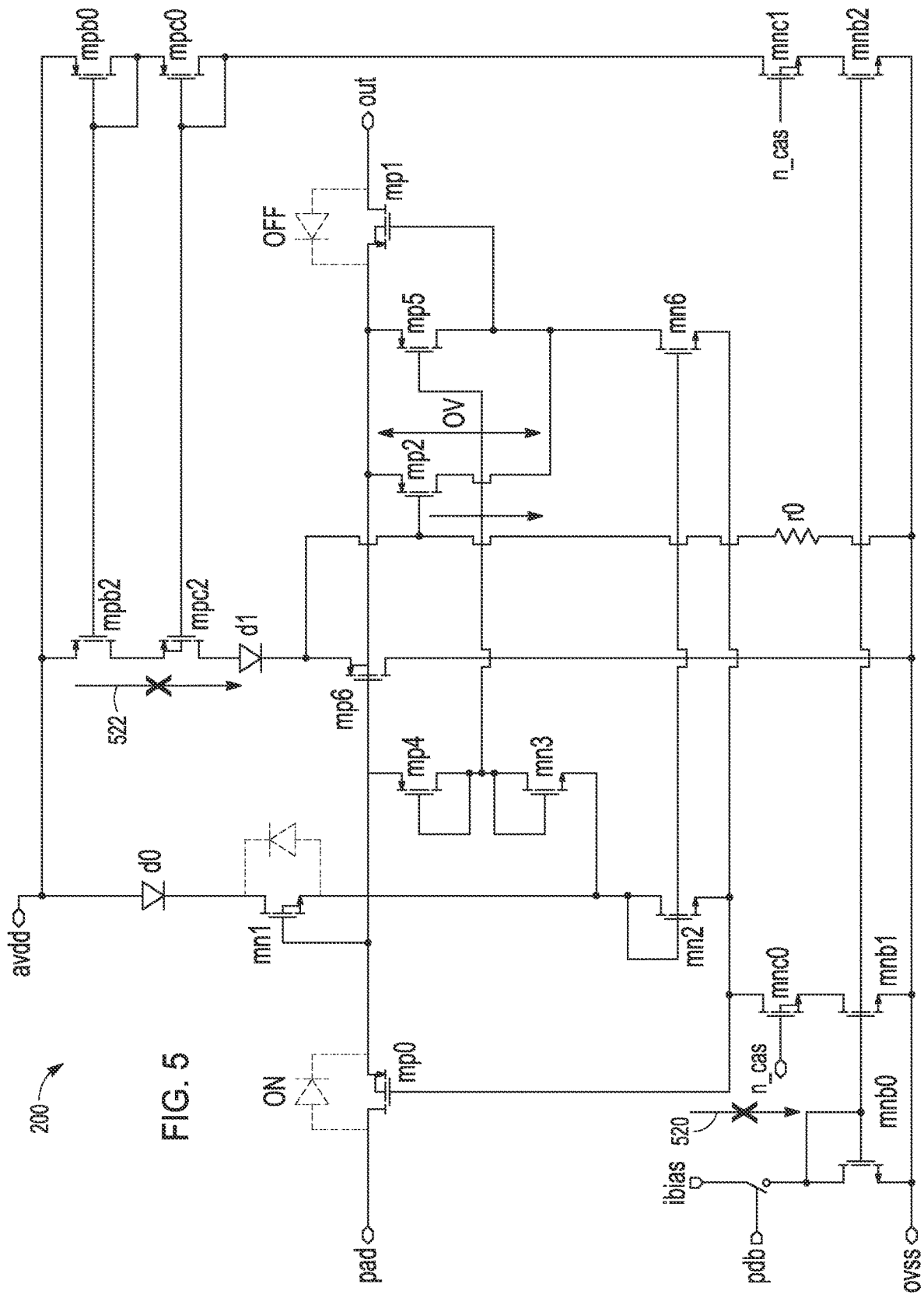
FIG. 5 is a circuit schematic of the example bootstrap line protector switch circuit of FIG. 2 in the off condition.

FIG. 5 is a circuit schematic of the example bootstrap line protector switch circuit 200 of FIG. 2 in the off condition. The bootstrap line protector switch circuit 200 can be turned off by cutting off the bias current as shown by arrows 520, 522. Cutting off the bias current causes the gate region of device 'mp2' to be pulled low by the resistor 'r0' which turns off transistor 'mp1.'

In use cases where the line protector switch is connected to an input pin (i.e., circuit node 'pad' is connected to an input pad or is connected to an input pin), the bootstrap line protector switch circuit 200 in the examples of FIGS. 2-5 normally provide sufficient protection without the bypass switch circuit 'mn8' of FIG. 1. However, in use cases where the line protector is connected to an output pin, there are limitations in using a line protector without a bypass switch circuit.

Figure 6:
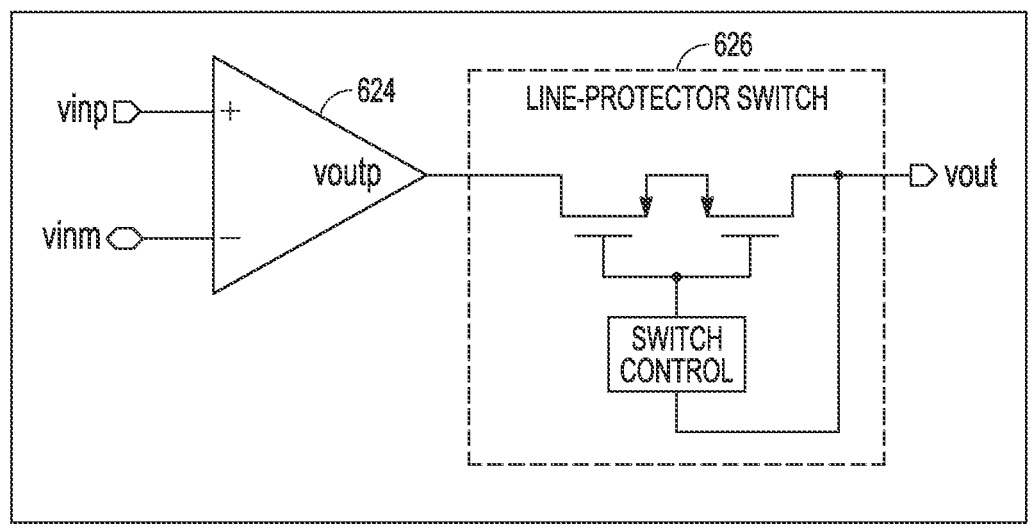
FIG. 6 is a block diagram of an example of circuitry internal to an integrated circuit.

FIG. 6 is a block diagram of an example of circuitry internal to an IC. The internal circuitry includes a driver circuit having an amplifier 624 that drives a voltage or voltage signal through a line protector 626 to an external output ('out). The external output 'vout' corresponds to the output 'pad' and the input connected to the amplifier output corresponds to 'out' in the line protector example of FIG. 2, In the example of FIG. 6, if there is a fault event at 'vout' in which the voltage gets pulled above the positive supply momentarily, the line protector 626 will turn off. But because a MOS device of the line protector (e.g., transistor 'mp1' of FIG. 2) is connected to the amplifier output 'voutp' in FIG. 6) is also turned off, the line protector 626 can take a long time to turn itself back on even after the fault condition is removed. Because the line protector 626 is off, the amplifier loses control of the voltage at the external output 'vout'. This is because there could be large capacitances at 'vout' which could take a long time to discharge. To mitigate this problem the line protector switch 626 is modified to include the bypass switch circuit 'mn8' of FIG. 1.

Figure 7:
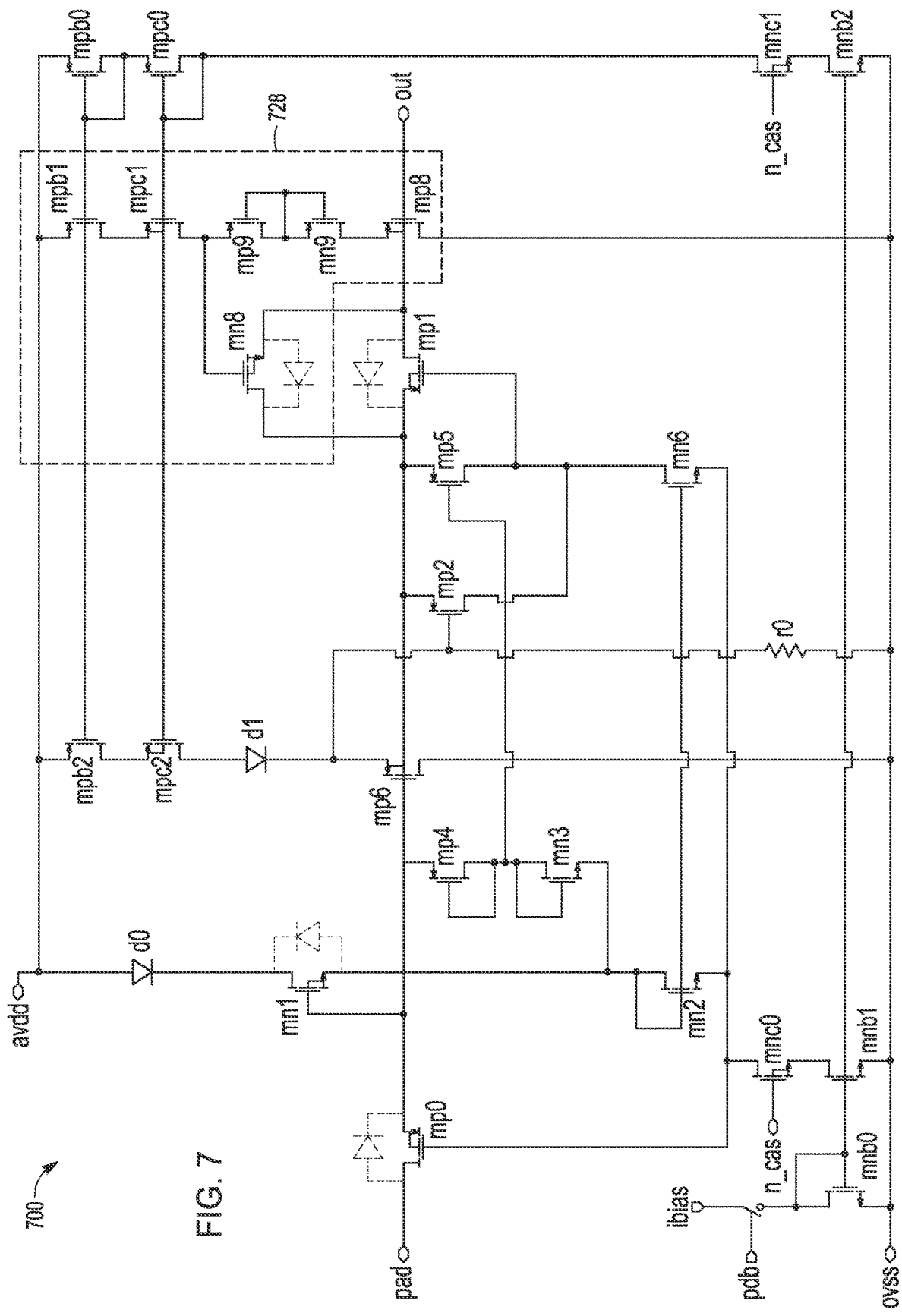
FIG. 7 is a circuit schematic of another example bootstrap line protector switch circuit.

FIG. 7 is a circuit schematic of another example bootstrap line protector switch circuit 700. The modification from the example in FIG. 2 is within box 728. The modification includes a bypass switch circuit added in parallel to the internal side switch transistor. The internal side switch may be a p-type field effect transistor (PFET), such as PMOS device 'mp1,' and the bypass switch circuit may be an n-type field effect transistor (NFET) such as NMOS device 'mn8.' The gate of device 'mn8' is driven by a voltage which is higher than the voltage at the terminal 'out'. This is achieved using PMOS devices 'mp8' and 'mp9,' and NMOS device 'mn9.' In variations, devices 'mp9' and 'mn9' are both PMOS, or are both NMOS devices. PMOS device 'mp9' is a diode connected transistor connected in series to diode connected NMOS device 'mn9' and connected to the gate region of device 'mn8.' Device 'mn9' is connected to the source region of PMOS device 'mp8,' and the gate region of 'mp8' is connected is coupled to the internal circuit node 'out.'

The device 'mn8' provides a conductive path from circuit node 'mid' to the internal side connection 'out.' But because device 'mn8' is an NMOS device, the maximum voltage that can be driven to 'out' by an external fault event at 'pad' is less than the high supply voltage by a threshold voltage of 'mn8' (i.e., avdd vth,mn8). The internal circuitry connected to 'out' is thus protected. In the case of a transient fault event, any capacitance at 'pad' is discharged very quickly by the amplifier through device 'mn8.' The line protector switch circuit 700 can recover very quickly from a transient fault condition.

Figure 8:
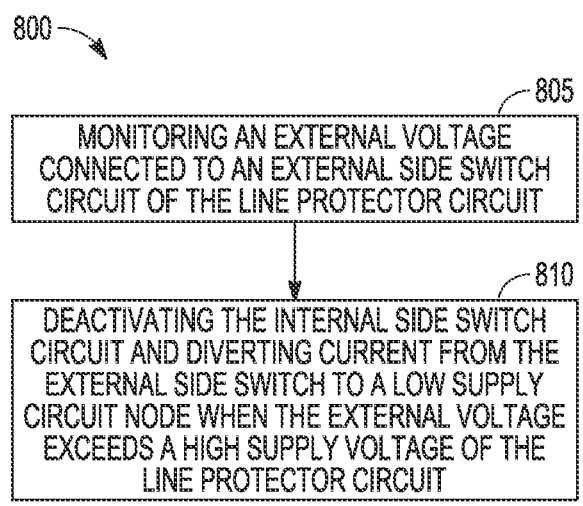
FIG. 8 is a flow diagram of an example of a method of operating a line protector circuit.

FIG. 8 is a flow diagram of an example of a method 800 of operating a line protector circuit. The method can be performed using any of the line protector circuit examples described herein. At block 805, an external voltage that is connected to an external side switch circuit of the line protector circuit is monitored. The line protector circuit includes the external switch circuit connected in series with an internal side switch circuit and the internal side switch circuit is connected to internal circuitry that is to be protected. At block 810, the internal side switch circuit is deactivated or turned off and the bias current is diverted, from the external side switch to a low supply circuit node when the external voltage exceeds a high supply voltage of the line protector circuit.

The several examples of systems, devices, and methods described provide for an electronic bootstrap line protector switch that can be used to protect circuitry internal to an IC from external transient or static events such as ESD events or miswiring. Including a bypass switch in the line protector provides a fast recovery from a transient event.

Additional Description and Aspects

A first Aspect (Aspect 1) includes subject matter (such as a line protector circuit) comprising an external side switch circuit coupled to an external circuit node of the line protector circuit, an internal side switch circuit coupled in series to the external side switch circuit and an internal circuit node of the line protector circuit, a h supply circuit node and a low supply circuit node, and switch control circuitry configured to deactivate the internal side switch circuit and divert a bias current from the external side switch to the low supply circuit node when the external voltage exceeds a high supply voltage of the high supply circuit node.

In Aspect 2, the subject matter of Aspect 1 optionally includes a bypass switch circuit connected in parallel to the internal side switch circuit, and bypass switch control circuitry configured to maintain activation of the bypass switch circuit when the external voltage exceeds the high supply voltage.

In Aspect 3, the subject matter of Aspect 2 optionally includes a bypass switch circuit includes an n-type field effect transistor (NFET) and the internal side switch circuit includes a p-type field effect transistor (PFET).

In Aspect 4, the subject matter of Aspect 3 optionally includes bypass switch control circuitry including a diode connected PFET coupled in series to a diode connected NFET and coupled to a gate region of the NFET of the bypass switch circuit, and the diode connected NFET is coupled to a drain region of a PFET having a gate region coupled to the internal circuit node.

In Aspect 5, the subject matter of one or any combination of Aspects 1-4 optionally includes switch control circuitry configured to deactivate both the external side switch and the internal side switch when the external voltage is less than a low supply voltage of the low supply circuit node.

In Aspect 6, the subject matter of one or any combination of Aspects 1-5 optionally includes a diode arranged between a high supply circuit node and the external side switch circuit that is reversed biased when the external voltage exceeds the high supply voltage.

In Aspect 7, the subject matter of one or any combination of Aspects 1-6 optionally includes a p-type substrate, and the external side switch circuit and the internal side switch circuit are p-type metal oxide semiconductor (PMOS) transistors.

In Aspect 8, the subject matter of one or any combination of Aspects 1-7 optionally includes an n-type substrate and wherein the external side switch circuit and the internal side switch circuit are n-type metal oxide semiconductor (NMOS) transistors.

Aspect 9 can include subject matter (such as a method of operating a line protector circuit) or can optionally be combined with one or any combination of Aspects 1-8 to include such subject matter, comprising monitoring an external voltage connected to an external side switch circuit of the line protector circuit, wherein the line protector circuit includes the external switch circuit connected in series with an internal side switch circuit and the internal side switch circuit is connected to internal circuitry; and deactivating the internal side switch circuit and diverting a bias current from the external side switch to a low supply circuit node when the external voltage exceeds a high supply voltage of the line protector circuit.

In Aspect 10, the subject matter of Aspect 9 optionally includes activating a bypass switch circuit connected in parallel to the internal side switch circuit using an output of the internal circuitry, and maintaining activation of the bypass switch circuit when the external voltage exceeds the high supply voltage.

In Aspect 11, the subject matter of Aspect 10 optionally includes activating an n-type field effect transistor (NFET) including in the bypass switch circuit in parallel with a p-type tiled effect transistor (PFET) included in the internal side switch circuit.

In Aspect 12, the subject matter of one or any combination of Aspects 9-11 optionally includes deactivating both the external side switch and the internal side switch when the external voltage is less than a low supply voltage of the low supply circuit node.

In Aspect 13, the subject matter of one or any combination of Aspects 9-12 optionally includes reverse biasing a diode arranged between a high supply circuit node and the external side switch circuit when the external voltage exceeds the high supply voltage.

Aspect 14 includes subject matter (such as an electronic system) or can optionally be combined with one or any combination of Aspects 1-13 to include such subject matter, comprising a line protector circuit including an analog switch circuit coupled to an external circuit node of the line protector circuit and an internal circuit node of the line protector circuit, a high supply circuit node and a low supply circuit node, switch control circuitry configured to deactivate the internal circuit node connection of the analog switch and divert a bias current from the external circuit node to the low supply circuit node when the external voltage exceeds a high supply voltage of the high supply circuit node, a bypass switch circuit connected to the internal circuit node, and bypass switch logic circuitry configured to maintain a connection to the internal circuit node when the external voltage exceeds the high supply voltage.

In Aspect 15, the subject matter of Aspect H optionally includes an analog switch circuit including an external side switch circuit coupled to the external circuit node and a middle circuit node and an internal side switch circuit coupled in series to the external side switch circuit, the middle circuit node, and the internal circuit node, and a bypass switch circuit configured to maintain a connection from the middle circuit node to the internal circuit node when the external voltage exceeds the high supply voltage.

In Aspect 16, the subject matter of Aspect 15 optionally includes a driver circuit coupled to the internal circuit node and configured to drive the external circuit node through the line protector circuit, and a bypass switch configured to maintain a connection from the output of the amplifier to the middle circuit node when the external voltage exceeds the high supply voltage.

In Aspect 17, the subject matter or one or both of Aspects 15 and 16 optionally includes a bypass switch circuit including an n-type field effect transistor (NFET) and an internal side switch circuit including a p-type field effect transistor (PFET).

In Aspect 18, the subject matter of Aspect 17 optionally includes bypass switch control circuitry including a diode connected PFET coupled in series to a diode connected NFET and coupled to a gate region of the NFET of the bypass switch circuit, and the diode connected NFET is coupled to a drain region of a PFET having a gate region coupled to the internal circuit node.

In Aspect 19, the subject matter of one or any combination of Aspects 14-18 optionally includes switch control circuitry configured to deactivate both the external side switch and the internal side switch when the external voltage is less than a low supply voltage of the low supply circuit node.

In Aspect 20, the subject matter of one or any combination of Aspects 14-19 optionally includes a diode arranged between a high supply circuit node and the external side switch circuit that is reversed biased when the external voltage exceeds the high supply voltage.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also; in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly, ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A line protector circuit comprising:
    an external side switch circuit coupled to an external circuit node of the line protector circuit:
    an internal side switch circuit coupled in series to the external side switch circuit and an internal circuit node of the line protector circuit;
    a high supply circuit node and a low supply circuit node;
    switch control circuitry configured to deactivate the internal side switch circuit and divert a bias current from the external side switch to the low supply circuit node when the external voltage exceeds a high supply voltage of the high supply circuit node;
    a bypass switch circuit connected in parallel to the internal side switch circuit; and
    bypass switch control circuitry configured to maintain activation of the bypass switch circuit when the external voltage exceeds the high supply voltage.

2. The line protector circuit of claim 1, wherein the bypass switch circuit includes an n-type field effect transistor (NFET) and the internal side switch circuit includes a p-type field effect transistor (PFET).

3. The line protector circuit of claim 2, wherein the bypass switch control circuitry includes a diode connected PFET coupled in series to a diode connected NFET and coupled to a gate region of the NFET of the bypass switch circuit, and the diode connected NFET is coupled to a drain region of a PFET having a gate region coupled to the internal circuit node.

4. The line protector circuit of claim 2, wherein the switch control circuitry is configured to deactivate both the external side switch and the internal side switch when the external voltage is less than a low supply voltage of the low supply circuit node.

5. The line protector circuit of claim 2, including a diode arranged between a high supply circuit node and the external side switch circuit that is reversed biased when the external voltage exceeds the high supply voltage.

6. The line protector circuit of claim 2, fabricated on a p-type substrate and wherein the external side switch circuit and the internal side switch circuit are p-type metal oxide semiconductor (PMOS) transistors.

7. The line protector circuit of claim 2, fabricated on an n-type substrate and wherein the external side switch circuit and the internal side switch circuit are n-type metal oxide semiconductor (NMOS) transistors.

8. A method of operating a line protector circuit, the method comprising:
    monitoring an external voltage connected to an external side switch circuit of the line protector circuit, wherein the line protector circuit includes the external switch circuit connected in series with an internal side switch circuit and the internal side switch circuit is connected to internal circuitry;

deactivating the internal side switch circuit and diverting a bias current from the external side switch to a low supply circuit node when the external voltage exceeds a high supply voltage of the line protector circuit;

activating a bypass switch circuit connected in parallel to the internal side switch circuit using an output of the internal circuitry; and maintaining activation of the bypass switch circuit when the external voltage exceeds the high supply voltage.

9. The method of claim 7, wherein activating the bypass switch circuit includes activating an n-type field effect transistor (NFET) including in the bypass switch circuit in parallel with a p-type filed effect transistor (PFET) included in the internal side switch circuit.

10. The method of claim 8, including deactivating both the external side switch and the internal side switch when the external voltage is less than a low supply voltage of the low supply circuit node.

11. The method of claim 8, including reverse biasing a diode arranged between a high supply circuit node and the external side switch circuit when the external voltage exceeds the high supply voltage.

12. An electronic system comprising:
a line protector circuit including:
an analog switch circuit coupled to an external circuit node of the line protector circuit and an internal circuit node of the line protector circuit;
a high supply circuit node and a low supply circuit node;
switch control circuitry configured to deactivate the internal circuit node connection of the analog switch and divert a bias current from the external circuit node to the low supply circuit node when the external voltage exceeds a high supply voltage of the high supply circuit node;
a bypass switch circuit connected to the internal circuit node; and
bypass switch logic circuitry configured to maintain a connection to the internal circuit node when the external voltage exceeds the high supply voltage.

13. The electronic system of claim 12,
wherein the analog switch circuit includes:
an external side switch circuit coupled to the external circuit node and a middle circuit node; and
an internal side switch circuit coupled in series to the external side switch circuit, the middle circuit node, and the internal circuit node; and
wherein the bypass switch circuit is configured to maintain a connection from the middle circuit node to the internal circuit node when the external voltage exceeds the high supply voltage.

14. The electronic system of claim 13, including:
a driver circuit coupled to the internal circuit node and configured to drive the external circuit node through the line protector circuit; and
wherein the bypass switch is configured to maintain a connection from the output of the amplifier to the middle circuit node when the external voltage exceeds the high supply voltage.

15. The electronic system of claim 13, wherein the bypass switch circuit includes an n-type field effect transistor (NFET) and the internal side switch circuit includes a p-type field effect transistor (PFET).

16. The electronic system of claim 15, wherein the bypass switch control circuitry includes a diode connected PFET coupled in series to a diode connected NFET and coupled to a gate region of the NFET of the bypass switch circuit, and the diode connected NFET is coupled to a drain region of a PFET having a gate region coupled to the internal circuit node.

17. The electronic system of claim 12, wherein the switch control circuitry is configured to deactivate both the external side switch and the internal side switch when the external voltage is less than a low supply voltage of the low supply circuit node.

18. The electronic system of claim 12, including a diode arranged between a high supply circuit node and the external side switch circuit that is reversed biased when the external voltage exceeds the high supply voltage.

* * * * *

UNITED STATES PATENT AND TRADEMARK OFFICE
CERTIFICATE OF CORRECTION

PATENT NO. : 11,855,451 B2  
APPLICATION NO. : 17/482917  
DATED : December 26, 2023  
INVENTOR(S) : Vijaykumar et al.

It is certified that error appears in the above-identified patent and that said Letters Patent is hereby corrected as shown below:

In the Claims

In Column 8, Line 17, in Claim 1, delete "circuit:" and insert --circuit;-- therefor In Column 8, Line 43, in Claim 4, delete "claim 2," and insert --claim 1,-- therefor In Column 8, Line 48, in Claim 5, delete "claim 2," and insert --claim 1,-- therefor In Column 8, Line 52, in Claim 6, delete "claim 2," and insert --claim 1,-- therefor In Column 8, Line 56, in Claim 7, delete "claim 2," and insert --claim 1,-- therefor In Column 9, Line 10, in Claim 9, delete "claim 7," and insert --claim 8,-- therefor In Column 9, Line 13, in Claim 9, delete "filed" and insert --field-- therefor Signed and Sealed this  
Eighteenth Day of February, 2025

Coke Morgan Stewart  
*Acting Director of the United States Patent and Trademark Office*